United States Patent [19]

Kawai et al.

[11] Patent Number: 5,223,085
[45] Date of Patent: Jun. 29, 1993

[54] PLASMA ETCHING METHOD WITH ENHANCED ANISOTROPIC PROPERTY AND APPARATUS THEREOF

[75] Inventors: Kenji Kawai; Moriaki Akazawa; Takahiro Maruyama; Toshiaki Ogawa; Hiroshi Morita, all of Hyogo, Japan

[73] Assignee: Mitsubishi Denki Kabushiki Kaisha, Tokyo, Japan

[21] Appl. No.: 653,634

[22] Filed: Feb. 12, 1991

[30] Foreign Application Priority Data

Feb. 20, 1990 [JP] Japan .................................. 2-40242

[51] Int. Cl.⁵ .............................. H01L 21/00
[52] U.S. Cl. .................. 156/646; 156/643; 156/664; 156/665; 156/662
[58] Field of Search ............. 156/643, 646, 664, 665, 156/662

[56] References Cited

U.S. PATENT DOCUMENTS

| | | | |
|---|---|---|---|
| 4,352,724 | 10/1982 | Sugishima et al. | 204/192.37 |
| 4,445,267 | 5/1984 | De La Moneda et al. | 437/41 |
| 4,502,915 | 3/1985 | Carter et al. | 156/651 |
| 4,528,066 | 7/1985 | Merkling et al. | 156/651 |
| 4,572,765 | 2/1986 | Berry | 156/643 |
| 4,680,085 | 7/1987 | Vijan et al. | 156/643 |
| 4,795,529 | 1/1989 | Kawasaki et al. | 156/345 |
| 4,799,991 | 1/1989 | Dockrey | 156/643 |
| 4,923,562 | 5/1990 | Jucha et al. | 156/646 |
| 4,997,520 | 3/1991 | Jucha et al. | 156/643 |

FOREIGN PATENT DOCUMENTS

| | | |
|---|---|---|
| 090067(B1) | 7/1986 | European Pat. Off. . |
| 3016736 | 11/1981 | Fed. Rep. of Germany . |
| 3844034 | 2/1990 | Fed. Rep. of Germany . |
| 58-053832 | 3/1983 | Japan . |
| 60-217634 | 4/1984 | Japan . |
| 1-205534 | 8/1989 | Japan . |

OTHER PUBLICATIONS

N. Fujiwara et al, "The Relationship Between Surface Potential and Etching Characteristics with ECR Plasma", 1988 Dry Process Symposium, pp. 9–14.

"Plasma Etching in Semiconductor Fabrication"; by Russ A. Morgan; ©1985; Elsevier; N.Y., N.Y.; pp. 88–89.

*Patent Abstracts of Japan*, C-680, vol. 14, No. 37 (Jan. 24, 1990), English abstract of Japanese Patent application No. 63-288376 published Nov. 15, 1988.

H. Uetake et al., "Anisotropic etching of n⁻ polycrystalline silicon with high selectivity using a chlorine and nitrogen plasma in an ultraclean electron cyclotron resonance etcher," *Appl. Phys. Lett.* 57 (6), Aug. 6, 1990, pp. 596–598.

*Primary Examiner*—David A. Simmons
*Assistant Examiner*—George Goudreau
*Attorney, Agent, or Firm*—Lowe, Price, LeBlanc & Becker

[57] ABSTRACT

A method for anisotropically etching a substrate to be treated using plasma of a reactive gas produced by electron cyclotron resonance is disclosed. A substrate to be treated is located in a processing container, and a chlorine gas and a hydrogen chloride gas are introduced into the processing container. From the mixture of the chlorine and hydrogen chloride gases introduced into the processing container, plasma of the mixed gas is produced by electron cyclotron resonance. According to this method, the energy of the plasma of chlorine is taken by the plasma of H⁻, which results in a decrease in kinetic energy of the chlorine. As a result, the plasma of chlorine impinges vertically to the substrate to be treated along the sheath electric field. Consequently, etching with strong anisotropic property is enabled.

9 Claims, 6 Drawing Sheets

PLASMA ETCHING METHOD WITH ENHANCED ANISOTROPIC PROPERTY AND APPARATUS THEREOF

BACKGROUND OF THE INVENTION

1. Field of the Invention

The present invention generally relates to a method of plasma etching, and more particularly to a method of plasma etching improved to enhance its anisotropic property. The present invention further relates to apparatus for implementing such a plasma etching method.

2. Description of the Prior Art

In manufacturing dynamic random access memories of 4-megabits or even higher integrated devices, the use of pattern of submicron is indispensable. It is necessary to form pattern having anisotropic profile without contamination and damage to implement submicron pattern for manufacturing VLSI devices. As technology satisfying this demand, a new etching technology using electron cyclotron resonance (hereinafter referred to as ECR) is proposed (1988 DRY PROCESS SYMPOSIUM p.9).

The plasma etching using ECR (hereinafter referred to as ECR plasma etching) is employed to perform etching of metal used for single crystal silicon, polysilicon, interconnection or the like with plasma of halogen gas such as $Cl_2$ gas or the like. This method enables etching of a substrate to be treated without contamination and damage.

FIG. 5 is a sectional view of a conventional plasma reaction apparatus employing ECR. The plasma reaction apparatus has a sample chamber 2 for accommodating a substrate 4 to be treated. A sample shelf 3 on which the substrate to be treated 4 is carried is provided in sample chamber 2. A plasma producing chamber 1 for producing plasma in it is connected to the upper part of sample chamber 2. A microwave introducing opening 5 is provided in the upper part of plasma producing chamber 1. A microwave source 6 is connected to microwave introducing opening 5 by a waveguide 40. Microwave source 6 is, for example, a magnetron or a klystron. Magnetic coils 9a, 9b for producing a magnetic field in plasma producing chamber 1 gas provided around plasma producing chamber 1. A gas introducing opening 50 for introducing reactive gas or the like into plasma producing chamber 1 is provided in the upper part of plasma producing chamber 1. An exhaust port 8 for exhausting the gas inside sample chamber 2 is provided in the lower portion of sample chamber 2.

Next, operation of the plasma reaction apparatus will be described. FIGS. 6A and 6B are sectional views showing the process of etching a substrate to be treated employing the plasma reaction apparatus.

The substrate 4 to be treated located on sample shelf 3. Referring to FIG. 6A, the substrate 4 is made by forming an oxide film 55 on a semiconductor substrate 53, forming an aluminum alloy film 54 on oxide film 55, and forming a resist pattern 52 with a predetermined form on the aluminum alloy film 54. Next, while introducing reactive gas ($Cl_2$, $Br_2$ or the like) into plasma producing chamber 1 through gas introducing opening 50, gas is exhausted through exhausting port 8. By this operation, the inside portion of plasma producing chamber 1 and sample chamber 2 is maintained at a predetermined degree of vacuum. In this condition, a magnetic field is produced in plasma producing chamber 1 by means of magnetic coils 9a, 9b. The microwave is supplied to plasma producing chamber 1 through microwave guide 40 from microwave source 6. The strength of the magnetic field is 875 gauss, for example, the frequency of the microwave is 2.45 GHz. Thus, electrons in the reactive gas absorb energy from the microwave and moves spirally. The spirally moving electrons impact against the reactive gas molecules, high density plasma of the reaction gas is produced thereby, and a plasma region 20 is produced in plasma producing chamber 1. The plasma of the reactive gas produced in plasma producing chamber 1 is transported into sample chamber 2 by magnetic lines of force. The gas plasma of the reaction gas transported into sample chamber 2 etches the surface of the treated substrate 4.

The surface etching of substrate 4 will be described in detail referring to FIG. 3B.

FIG. 3B shows the motion of the reactive ion species in a conventional plasma etching method. $Cl_2$ gas is used as the reactive gas. Referring to FIG. 3B, a substrate 4, which is to be treated, is carried on a sample shelf 3. Substrate 4 includes semiconductor substrate 53, an oxide film 55 formed on the semiconductor substrate 53, an aluminum alloy film 54 formed on the oxide film 55 (etched to be an interconnection), and a resist pattern 52 formed on the aluminum alloy film 54.

Now, when a plasma region 20 is formed a sample chamber (not shown in FIG. 3B), the sample shelf carrying the substrate 4 which is to be treated is negatively charged. Then, a strong electric field region referred to as a sheath region 51 is produced between plasma region 20 and sample shelf 3. The reactive ions ($Cl^-$) in plasma region 20 are accelerated by means of the electric field in the sheath region 51 and directed onto substrate 4. In this way, aluminum alloy film 54 is gradually etched, as shown in FIG. 6B, to give an interconnection pattern 54a. According to this method, the etching of aluminum alloy film 54 can be performed without contamination and damage of the substrate to be treated 4 under treatment.

However, as a feature of the ECR discharge, because of the weak electric field of sheath region 51, as shown in FIG. 3B, the reactive ions ($Cl^-$) existing in plasma region 20 do not vertically impinge onto the substrate 4 being treated. Thus, in the ECR discharge, sufficient anisotropic etching can not be performed, and referring to FIG. 6B, the sectional shape of interconnection pattern 54a becomes taper-like.

As another prior art in connection with the present invention, Japanese Patent Laying-Open No. 60-217634 discloses a plasma etching method, although it is not a method using the ECR discharge, characterized by plasma etching aluminum or the like a mixed gas including chlorine type reactive gas and hydrogen gas. However, since the ECR discharge is not employed in this method, they have had problems such as contamination and damage of a semiconductor substrate. Also, in this prior art, $H_2$ gas only is disclosed and no disclosure was made with respect to other gases with which the anisotropic property seems to be enhanced.

SUMMARY OF THE INVENTION

Accordingly, it is an object of the present invention to provide a method of plasma etching of a substrate to be treated without contamination and damage of the substrate to be treated.

It is another object of the present invention to enhance the anisotropic property of plasma etching in a method of etching a substrate to be treated employing plasma of a reactive gas produced employing electron cyclotron resonance.

It is still another object of the present invention to enhance the anisotropic property of the plasma etching in a method of etching a substrate to be treated employing plasma of a reactive gas produced using a parallel plate electrode.

It is yet another object of the present invention to provide a plasma etching apparatus which can plasma-etch a substrate to be treated without contamination and damage of the substrate to be treated.

It is still yet another object of the present invention to improve a plasma etching apparatus employing electron cyclotron resonance to enhance its anisotropic property.

It is still another object of the present invention to improve a plasma etching apparatus having a parallel plate electrode to enhance its anisotropic property.

To achieve the above-described objects, the method of plasma etching according to the present invention relates to a method of anisotropic etching of a substrate to be treated using plasma of reactive gas produced by electron cyclotron resonance. First, a substrate to be treated is located in a processing container. Reactive gas is introduced into the processing container. Light gas including molecules having mass smaller than those of any molecules constituting the above reactive gas is introduced into the processing container. The mixed gas plasma is produced by the electron cyclotron resonance from the mixed gas composed of the reactive gas and the light gas introduced into the processing container.

According to a preferable embodiment of the present invention, the light gas comprises a hydrogen halide selected from the group consisting of HF, HC$l$, HBr and HI.

A preferable apparatus for implementing the above method is provided with a processing container for accommodating a substrate to be treated, and a reactive gas supply means for supplying reactive gas into the processing container attached to the above processing container. In the processing container, a light gas supply means for supplying light gas including molecules having smaller mass than any molecules constituting the above reactive gas is attached. The apparatus is further provided with plasma producing means for producing plasma of the mixed gas by means of electron cyclotron resonance from the mixed gas composed of the above reactive gas and the above light gas introduced into above processing container.

A method of plasma etching according to another aspect of the present invention relates to a method in which a substrate to be treated is anisotropically etched by plasma of a reactive gas. First, a substrate to be treated is located in a processing container. A reactive gas is introduced in the processing container. Hydrogen halide selected from the group consisting of HF, HC$l$, HBr and HI is introduced into the processing container. Subsequently, from a mixed gas composed of the reactive gas and the hydrogen halide, plasma of the mixed gas is produced.

A preferable plasma etching apparatus for implementing the plasma etching method comprises a processing container accommodating a substrate to be treated and a reactive gas supply means mounted in the processing container for supplying the reactive gas into the processing container. In the processing container, means for supplying hydrogen halide selected from the group consisting of HF, HC$l$, HBr and HI is provided. The above apparatus has means for forming plasma from the mixed gas composed of the above reactive gas and the above hydrogen halide.

According to the plasma etching method employing electron cyclotron resonance according to the present invention, a light gas including molecules having mass smaller than those of any molecules constituting a reactive gas is introduced into the processing container together with the reactive gas. Therefore, when plasma is produced from this mixed gas by electronic cyclotron resonance, although the reason is not clear, the energy of the reactive ions is taken by the plasma of molecules having smaller mass included in the light gas, resulting in a decrease in kinetic energy of the reactive ions. As a result, when the reactive ions reach the sheath region, as the kinetic energy is decreased, they impinge vertically to the substrate to be treated along the sheath electric field. Thus, etching with strong anisotropic property is enabled.

In a plasma etching method according to another aspect of the present invention, hydrogen halide selected from the group consisting of HF, HC$l$, HBr and HI is introduced into the processing container together with reactive gas. Therefore, when plasma is produced from this mixed gas, although the reason is not clearly understood, the energy of the reactive ion is taken by the plasma of hydrogen which includes atoms with smaller mass, resulting in a decrease in kinetic energy of the reactive ions. As a result, when the reactive ions reach the sheath region, with its kinetic energy decreased, they impinge vertically on the substrate to be treated along the sheath electric field. Thus, etching with strong anisotropic property is enabled. Also, according to the present invention, the plasma of halogen (e.g., C$l^-$) is produced from hydrogen halide, so that the plasma of the halogen also contributes to the etching. As a result, the plasma etching is performed more efficiently.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below referring to figures.

Figure 1:
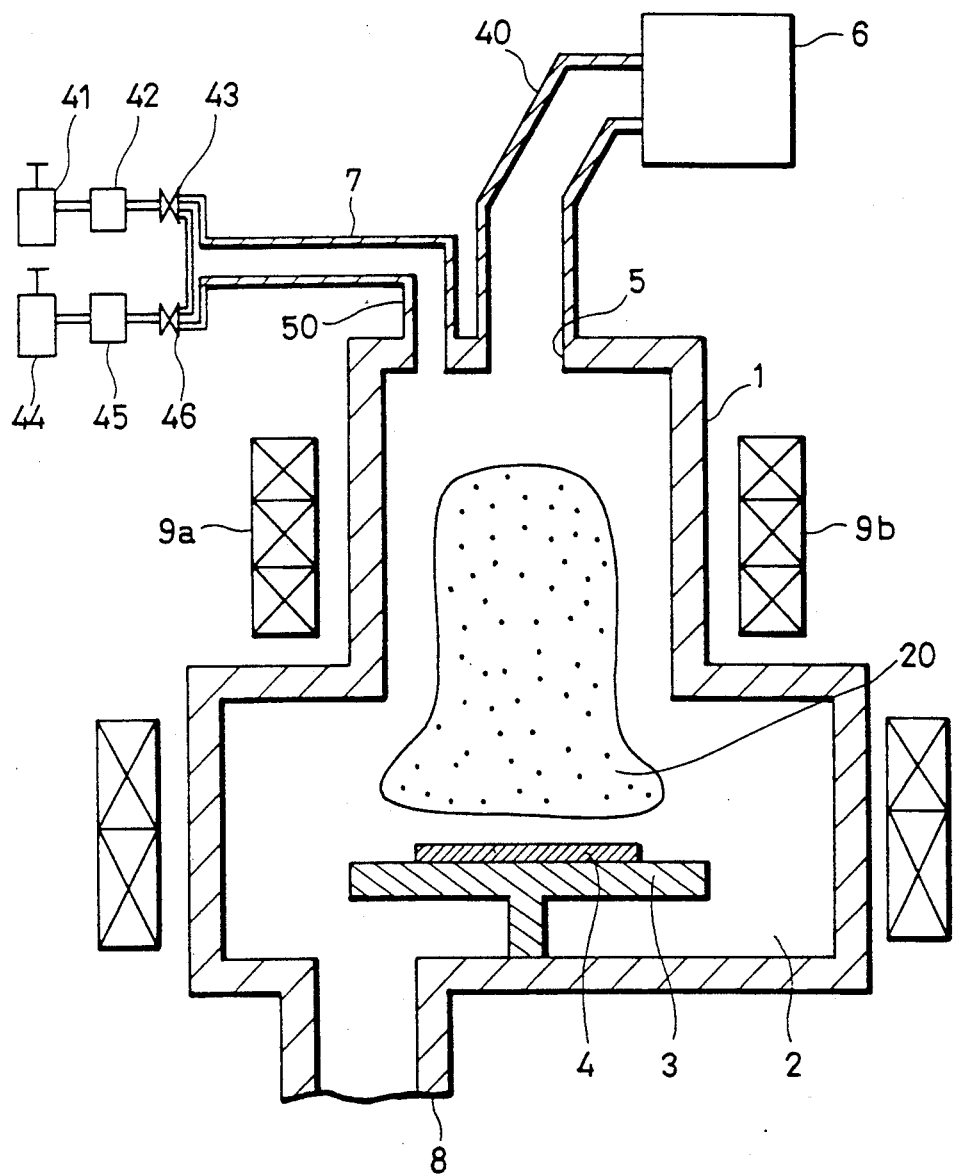
FIG. 1 is a sectional view of a plasma etching apparatus for implementing one embodiment of the present invention.
Figure 5:
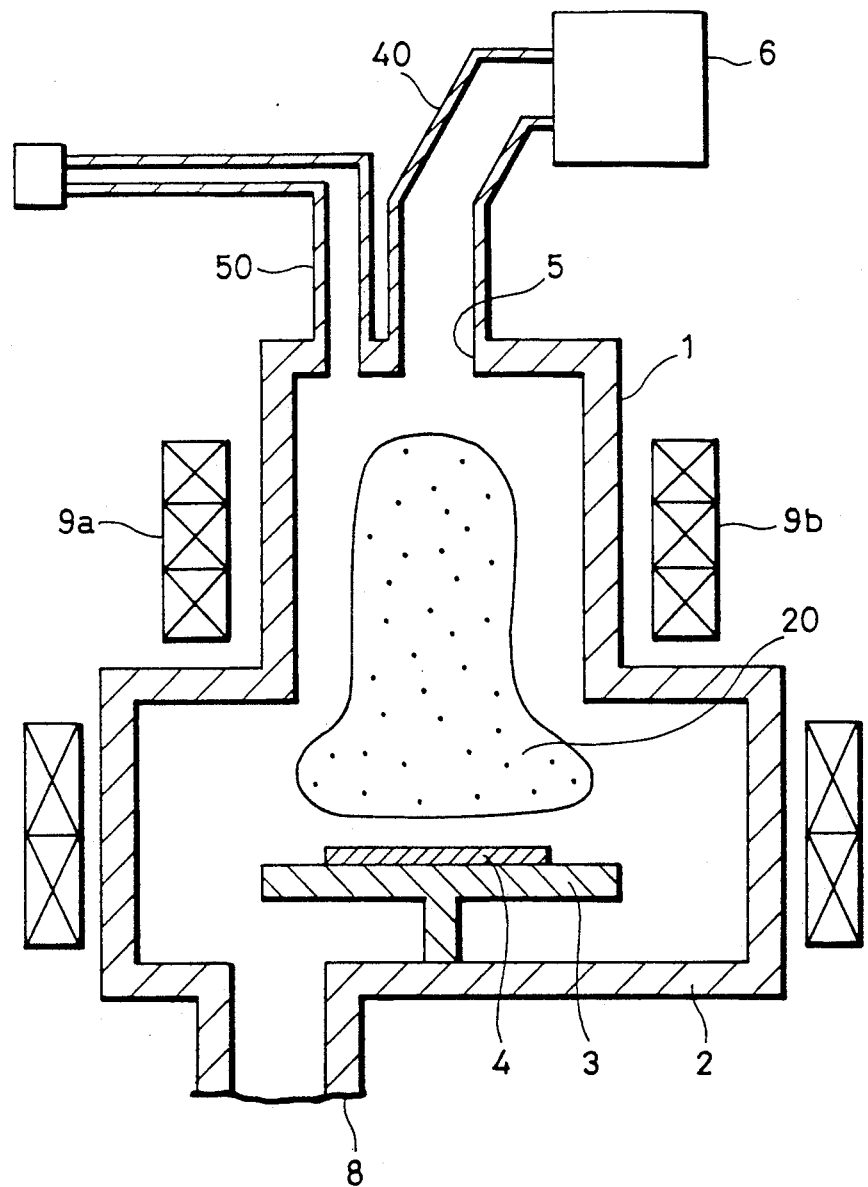
FIG. 5 is a sectional view of a conventional plasma etching apparatus employing electron cyclotron resonance.
Figure 6A:
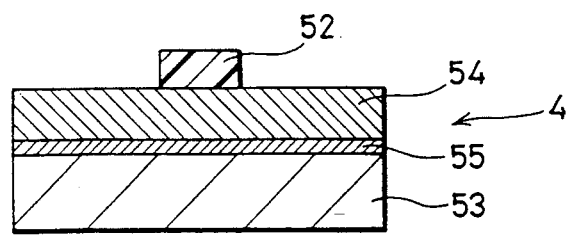
FIGS. 6A and 6B are sectional views showing the conventional steps of etching a substrate to be treated by ECR resonance.
Figure 6B:
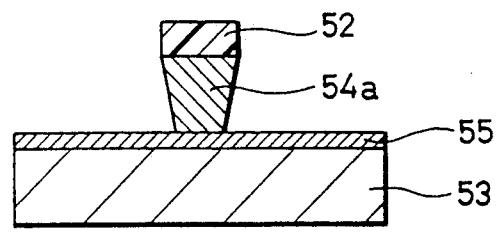

FIG. 1 is a sectional view of a plasma etching apparatus used for practice of this invention. The plasma etching apparatus shown in FIG. 1 is the same as the conventional plasma etching apparatus shown in FIG. 5 except for several points discussed below, so that the corresponding portions are assigned the same reference numerals and the description thereof is not repeated.

Referring to FIG. 1, a gas introducing tube 7 is connected to a gas introducing opening 50. A halogen-bomb 41 filled with halogen gas which is a reactive gas is connected to gas introducing tube 7 through a mass flow controller 42 and a valve 43. The plasma apparatus shown in FIG. 1 is different from the conventional apparatus shown in FIG. 5 in that hydrogen halide-bomb 44 filled with hydrogen halide is connected to gas introducing tube 7 through mass flow controller 45 and valve 46.

Next, a method for forming an interconnection pattern on a semiconductor substrate employing the above-described plasma etching apparatus will be described.

Figure 2A:
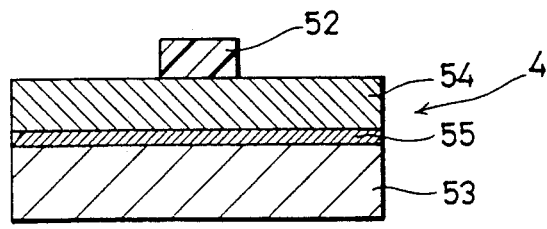
FIGS. 2A–2C are sectional views showing steps of forming an interconnection pattern on a semiconductor substrate employing this invention.
Figure 2B:
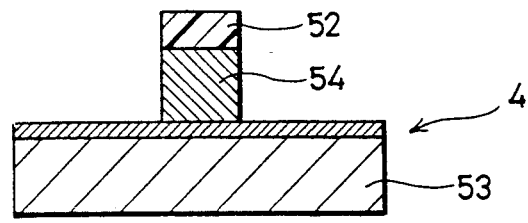
Figure 2C:
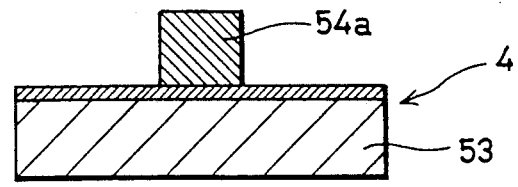

FIGS. 2A-2C are sectional views for describing the steps of forming an interconnection pattern on a semiconductor substrate.

Referring to FIG. 2A, an oxide film 55 is formed on a semiconductor substrate 53 and an aluminum alloy film 54 is formed on oxide film 55. A resist pattern 52 having a predetermined shape is formed on aluminum alloy film 54.

Referring to FIG. 1, the substrate to be treated 4 made in this way is carried on a sample shelf 3. Next, valve 43 is opened to introduce reactive gas from halogenbomb 41 to plasma producing chamber 1. At the same time, valve 46 is opened to introduce hydrogen halide from hydrogen halide-bomb 44 into plasma producing chamber 1. The introduced amount of the hydrogen halide is 20–70% of the reactive gas in volume, preferably 50% in volume. The reactive gas is halogen gas and preferably $Cl_2$. The preferable hydrogen halide gas is $HCl$ gas. The $HCl$ gas and the $Cl_2$ gas are introduced into plasma producing chamber 1 at the flow rate of the entire mixed gas of 30-200 SCCM (standard cubic centimeter per minute). Next, the gas existing in plasma producing chamber 1 and sample chamber 2 is exhausted through exhaust port 8 so that the vacuum in plasma producing chamber 1 and sample chamber 2 becomes 0.1–1 Pa. In this condition, a magnetic field is produced in plasma producing chamber 1 by means of magnetic coils 9a, 9b. Microwave energy is supplied into plasma producing chamber 1 by way of waveguide 40 from microwave source 6 at power of 50-500 W. The strength of the magnetic field is, for example, 875 gauss, and then the frequency of the microwave is 2.45 GHz, for example. In this way, electrons in the reactive gas absorb energy from the microwave to ionize reactive gas molecules. This is referred to as electron cyclotron resonance, which produces a plasma region 20 in plasma producing chamber 1.

Figure 3A:
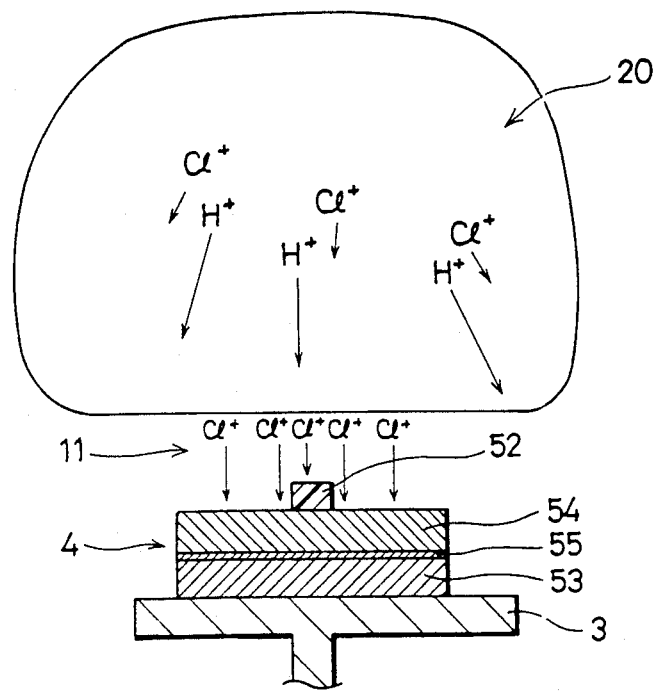
FIG. 3A is a diagram showing movement of the reactive ion species in case where plasma is produced in a mixed gas system composed of C$l_2$ gas and HC$l$ gas.
Figure 3B:
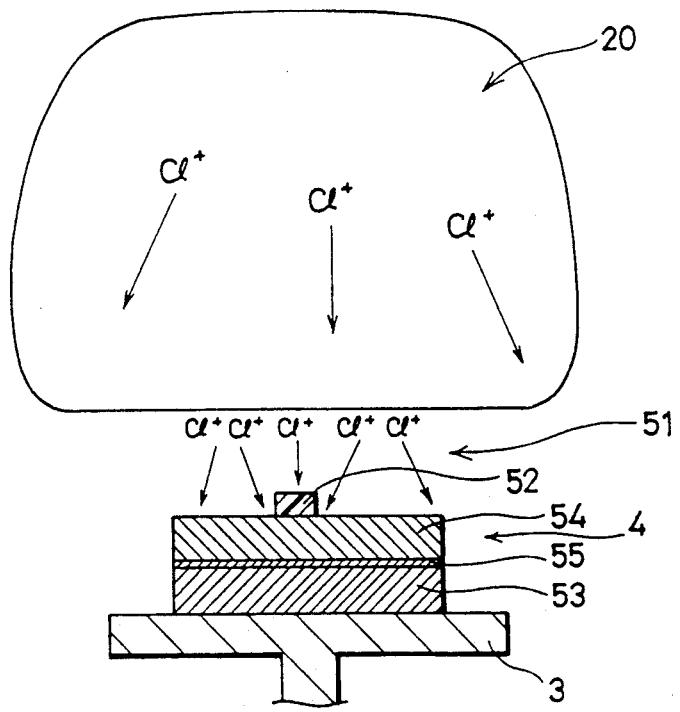
FIG. 3B is a diagram showing movement of the reactive ion species in a conventional case where the plasma is produced by electron cyclotron resonance.

FIG. 3A shows movement of the reactive ion species where plasma is produced in the mixed gas system according to the first embodiment. When plasma is produced from mixed gas of $Cl_2$ gas and $HCl$ gas by ECR resonance, although the reason is not clearly understood, the energy of the reactive ions ($Cl^+$) is taken by the plasma of $H^-$, resulting in a decrease in kinetic energy of the $Cl^-$ ions. As a result, on reaching the sheath region 11, the $Cl^-$ ions with kinetic energy decreased, impinge vertically on the substrate 4 being treated, along the sheath electric field. Thus, referring to FIG. 2B, the aluminum alloy film 54 can be etched with strong anisotropic property. In this case, since the plasma of halogen ($Cl^-$) is produced from hydrogen halide, this halogen plasma also contributes to etching. As a result, plasma etching can be performed more efficiently.

Next, referring to FIGS. 2B and 2C, removing resist pattern 52, an interconnection pattern 54a having sidewalls vertical to substrate 4 can be obtained.

Although the $Cl_2$ gas is illustrated as an example of reactive gas in the above embodiments, the present invention is not limited to this gas, and it may be other halogen gas or other reactive gas such as $CF_4$, $SF_6$, $NF_3$ and $CHF_3$.

Also, although a case where $HCl$ gas is employed as light gas has been illustrated in the above embodiment, the present invention is not limited to this, and any gas including molecules having mass smaller than that of molecules constituting the reactive gas can be used. For example, hydrogen halide such as HF, HBr and HI, or hydrogen gas can be used.

Also, although the aluminum alloy is illustrated as an example of the material to be etched, it may be other material such as poly-Si, W, WSi and A/Si.

Figure 4:
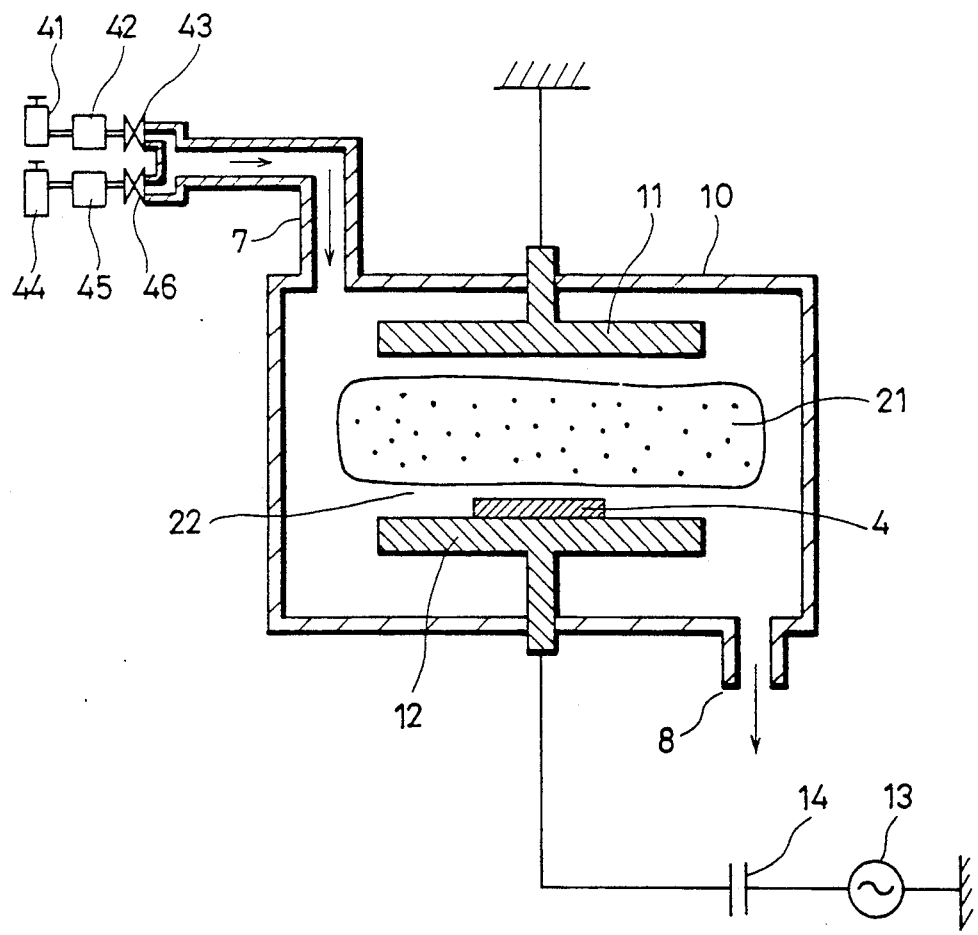
FIG. 4 is a sectional view of a plasma etching apparatus for implementing the method according to another embodiment of the present invention.

FIG. 4 is a sectional view of a plasma etching apparatus of parallel plate type according to another embodiment of the present invention. The apparatus produces plasma of reactive gas without employing ECR resonance.

Referring to FIG. 4, the plasma etching apparatus has a hollow processing container 10. In the processing container 10, a plate high frequency electrode 11 and a flat plate high frequency electrode 12 are each other in parallel. An exhaust port 8 for exhausting the gas in the processing container 10 to implement vacuum condition therein is provided in the lower portion of processing container 10. A gas introducing tube 7 for introducing reactive gas into processing container 10 is provided in the upper portion of processing container 10. A halogen-bomb 41 filled with halogen gas is connected to gas introducing tube 7 with mass flow controller 42 and valve 43 provided therebetween. Hydrogen halide-bomb 44 filled with hydrogen halide is also connected to gas introducing tube 7 with mass flow controller 42 and valve 46 provided therebetween. Plate high-frequency electrode 11 is provided in an upper portion. The output of high-frequency power source 13 is connected to plate high-frequency electrode 12 provided in the lower portion with capacitor 14 provided therebetween. A substrate 4 which is to be treated is carried on plate high-frequency electrode 12 provided in the lower portion.

Next, an operation of etching a substrate employing the above plasma etching apparatus will be described.

Referring to FIG. 4, the substrate to be treated is located on plate high-frequency electrode 12 located near the bottom of chamber 10. Next, valve 43 is opened to introduce halogen gas into processing chamber 10 from halogen-bomb 41. At the same time, valve 46 is opened to introduce hydrogen halide into processing chamber 10 from hydrogen halide-bomb 44. The amount of the introduced hydrogen halide is about 50% of the halogen gas. The halogen gas preferably is $Cl_2$ gas, and the hydrogen halide is $HC_l$ gas. Simultaneously with introducing halogen gas and the hydrogen halide gas into processing chamber 10, the gas is sucked from exhaust port 8. By this operation, the interior of processing chamber 10 is maintained at a given degree of vacuum. Upon turning on of high-frequency power source 13, a high-frequency voltage is applied between plate high-frequency electrode 11 and plate high-frequency electrode 12. Upon application of the high-frequency voltage, plasma of the mixed gas composed of $C_{l2}$ gas and $HC_l$ gas is produced between plate high-frequency electrode 11 and plate high-frequency electrode 12 to produce plasma region 21 in processing container 10. When the interior of processing container 10 attains such a condition, plate high-frequency electrode 12 which carries the substrate 4 is negatively charged. Then, a strong electric field region referred to as sheath region 22 is produced between plasma region 21 and plate high-frequency electrode 12. The reactive ions produced in the plasma impinge on substrate 4 to be treated along the electric field in the sheath region 22. At this time, the energy of the reactive ions ($C_l^+$) is taken by the plasma of $H^-$, resulting in a decrease of kinetic energy of the reactive ions. As a result, upon reaching sheath region 22, the reactive ions having kinetic energy decreased impinge vertically on the substrate to be treated along the sheath electric field. As a result, etching with strong anisotropic property is enabled.

As described above, according to the method of plasma etching employing electron cyclotron resonance of the present invention, light gas including molecules having smaller mass than any molecules constituting a reactive gas is introduced into processing container together with the reactive gas. Accordingly, when plasma is produced from the mixed gas by electron cyclotron resonance, the energy of the reactive ions is taken by the plasma of molecules having smaller mass included in the light gas, which results in a decrease of kinetic energy of the reactive ions. As a result, when the reactive ions reach the sheath region, since its kinetic energy is reduced, they impinge vertically on the substrate to be treated along the sheath electric field. Accordingly, the effect is to enable etching with strong anisotropic property.

According to the method of plasma etching according to another aspect of the present invention, hydrogen halide selected from the group consisting of HF, $HC_l$, HBr and HI is introduced into the processing container together with reactive gas. Accordingly, when plasma is produced from the mixed gas, the energy of the reactive ions are taken by the plasma of hydrogen ($H^+$), which results in a decrease of kinetic energy of the reactive ions. As a result, when reaching the sheath region, the reactive ions having reduced kinetic energy impinge vertically on the substrate to be treated along the sheath electric field. Thus, etching with strong anisotropic property is enabled. Also, according to the present invention, plasma of halogen ($C_l^-$, for example), is produced from hydrogen halide, so that the halogen plasma also contributes to etching. As a result, it has an effect of efficient plasma etching.

Although the present invention has been described and illustrated in detail, it is clearly understood that the same is by way of illustration and example only and is not to be taken by way of limitation, the spirit and scope of the present invention being limited only by the terms of the appended claims.

We claim:

1. A method of etching a substrate interconnection layer of material selected from the group consisting of aluminum alloy, polysilicon, tungsten and tungsten silicide, comprising the steps of:
    locating said substrate into a processing container;
    introducing a gas mixture into said processing container, said gas mixture consisting of a halogen gas which is reactive and a light gas selected from the group consisting of hydrogen (H2) and hydrogen halide;
    forming a plasma of the gas mixture in said processing container by electron cyclotron resonance; and
    directing said plasma to said substrate interconnection layer for etching.

2. The method according to claim 1, wherein said halogen gas comprises a chlorine gas.

3. The method according to claim 1, wherein said light gas comprises hydrogen halide selected from the group consisting of HF, $HC_l$, HBr and HI.

4. The method according to claim 1, wherein the steps of forming plasma of said mixed gas by electron cyclotron resonance comprises the steps of:
    supplying microwave energy to said processing container in which said mixed gas is introduced;
    producing a magnetic field in said processing container in which said mixed gas is introduced; and
    exhausting a part of said mixed gas from said processing container.

5. The method according to claim 1, wherein said light gas is introduced into said processing container so that said light gas is included in said mixed gas by 20-70% in volume.

6. The method according to claim 5, wherein said light gas is introduced into said processing container so that the amount of said light gas in said mixed gas is approximately 50% in volume.

7. The method according to claim 1, wherein said reactive gas and said light gas are introduced into said processing container at flow rate of the entire mixed gas of 30-2000 SCCM.

8. The method according to claim 4, wherein said microwave energy is introduced into said processing container at a power of approximately 50-500 W.

9. The method according to claim 4, wherein said exhausting step is performed so that the vacuum of said processing container is approximately 0.1-1 Pa.

* * * * *